United States Patent [19]

Salour et al.

[11] Patent Number: 4,495,782

[45] Date of Patent: Jan. 29, 1985

[54] TRANSMISSIVE DEWAR COOLING CHAMBER FOR OPTICALLY PUMPED SEMICONDUCTOR RING LASERS

[75] Inventors: Michael M. Salour, La Jolla, Calif.; Adrian Fuchs, Cham, Switzerland

[73] Assignee: The United States of America as represented by the Secretary of the Air Force, Washington, D.C.

[21] Appl. No.: 552,555

[22] Filed: Nov. 16, 1983

[51] Int. Cl.$^3$ ............................................. F25B 19/00
[52] U.S. Cl. .................................... 62/514 R; 250/352
[58] Field of Search .............. 62/264, 514 R; 250/352

[56] References Cited

U.S. PATENT DOCUMENTS

| | | | |
|---|---|---|---|
| 3,180,989 | 4/1965 | Hand, Jr. et al. | 62/514 R |
| 3,258,602 | 6/1966 | Promish | 62/514 R |
| 3,851,173 | 11/1974 | Taylor et al. | 62/514 R |
| 3,991,585 | 11/1976 | Mulder | 62/6 |
| 4,194,119 | 3/1980 | MacKenzie | 250/352 |
| 4,408,464 | 10/1983 | Salour et al. | 62/514 R |

OTHER PUBLICATIONS

Green et al., "Traveling-Wave Operation of a Tunable CW Dye Laser," Optics Communications, vol. 7, No. 4, Apr. 1973, pp. 349-350.
Jarrett et al., "High-Efficiency Single Frequency CW Ring Dye Laser," Optics Letters, vol. 4, No. 6, Jun. 1976, pp. 176-178.
Roxlo et al., "Optically Pumped Semiconductor Platelet Lasers," IEEE Journal of Quantum Electronics, vol. QE-18, No. 3, Mar. 1982, pp. 338-342.
Rotman et al., "Pulse-Width Stabilization of a Synchronously Pumped Mode-Locked Dye Laser," Appl. Phys. Lett., 36(11), Jun. 1, 1980, pp. 886-888.
Roxlo et al., "Tunable CW Bulk Semiconductor Platelet Laser," Appl. Phys. Lett., vol. 38, No. 7, Apr. 1, 1981, pp. 507-509.
Roxlo et al., "Synchronously Pumped Mode-Locked CDS Platelet Laser," appl. Phys. Lett., vol. 38, No. 10, May 15, 1981, pp. 738-740.
Roxlo et al., "Dewar Design for Optically Pumped Semiconductor Lasers," Review of Sci. Instr., vol. 53, No. 4, Apr. 1982, pp. 458-460.
Fuchs et al., "Optically Pumped CW Semiconductor Ring Laser," Appl. Phys. Lett., vol. 43, No. 1, Jul. 1, 1983, pp. 32-34.

Primary Examiner—Ronald C. Capossela
Attorney, Agent, or Firm—Donald J. Singer; Jacob N. Erlich

[57] ABSTRACT

A transmission Dewar cooling chamber having a housing for supporting a semiconductor crystal therein within a temperature controlled environment. The housing has walls made partially of material transmissive to a preselected wavelength in order to allow the passing of a beam of electromagnetic radiation completely through the housing. In addition, mounting means are provided to move the housing in at least two dimensions. Securing the semiconductor crystal in place within the housing is a uniquely designed frame/-mount arrangement which aids in establishing the temperature controlled environment for the crystal while also allowing the beam of electromagnetic radiation to pass completely through the crystal.

20 Claims, 4 Drawing Figures

TRANSMISSIVE DEWAR COOLING CHAMBER FOR OPTICALLY PUMPED SEMICONDUCTOR RING LASERS

STATEMENT OF GOVERNMENT INTEREST

The invention described herein may be manufactured and used by or for the Government for governmental purposes without the payment of any royalty thereon.

BACKGROUND OF THE INVENTION

This invention relates generally to cooling chambers, and, more particularly, to a transmissive Dewar cooling chamber which is capable of mounting semiconductor crystal platelets therein for movement in two dimensions within a semiconductor ring laser In recent years, the use of semiconductor devices has expanded greatly. An area of particular interest involving semiconductors is the optically pumped semiconductor laser. In fact, recent advances in laser research have led to the development by one of the inventors of optically pumped semiconductor lasers. Of particular interest are such lasers as described in an article by C. B. Roxlo, D. Bebelaar, and M. M. Salour, "Tunable CW bulk semiconductor platelet laser," *Applied Physics Letters*, Vol. 38, No. 7, April 1, 1981, pp 507–509 and an article by C. B. Roxlo and M. M. Salour, "Synchronously pumped mode-locked CdS platelet laser," *Applied Physics Letters*, Vol. 38, No. 10, May 15, 1981, pp 738–740.

In order to provide optimal outputs in such semiconductor lasers, the semiconductor platelets must be cooled to liquid nitrogen temperatures or below. This has been accomplished by one of the inventors by providing a uniquely designed Dewar cooling chamber for the above mentioned semiconductor platelet lasers. Such a Dewar cooling chamber is more fully described in an article by C. B. Roxlo and M. M. Salour, "Dewar design for optically pumped semicondcutor lasers," *Review of Scientific Instruments*, Vol. 53, No. 4, April 1982, pp 458–460 and is also described in U.S. patent application Ser. No. 361,020 filed on Mar. 23, 1982 and now U.S. Pat. No. 4,408,464 issued on Oct. 11, 1983.

With requirements for larger and larger output power much effort has gone into producing an optically pumped semiconductor laser having a ring resonant cavity. An example of such an optically pumped CW semiconductor ring laser can be found in U.S. patent application Ser. No. 552,554 filed together with this patent application by one of the inventors and incorporated herein by reference. The problems encountered in the past with respect to semiconductor lasers become even greater when dealing with the semiconductor ring laser. Because of bidirectional lasing associated with such semiconductor ring lasers, temperature control becomes even more critical. In addition, since tuning of such a laser is highly desirable it must also be possible to provide a temperature control within the cooling chamber. Unfortunately, the type of Dewar cooling system as described in the above-mentioned article in *Review of Scientific Instruments* and the above-identified U.S. Pat. No. 4,408,464 cannot be incorporated within the semiconductor ring laser. Therefore, without an appropriate cooling chamber for use within such a semiconductor ring laser it is virtually impossible for lasing to take place and for operation of such a laser to be reliable.

Consequently, it becomes essential to provide a mounting arrangement for the semiconductor crystal or crystal platelet within the semiconductor ring laser which not only allows for precise alignment of the crystal but also for accurate temperature control of the crystal, sufficient cooling of the crystal, and extremely tight pump beam focus upon the crystal to take place.

SUMMARY OF THE INVENTION

The present invention overcomes the problems encountered with prior Dewar cooling chambers by providing a transmissive Dewar cooling chamber which is readily adaptable for use within an optically pumped CW semiconductor ring laser.

Making up the transmissive Dewar cooling chamber of this invention is a housing having a pair of optically transparent windows capable of passing both the pump beam and the laser beam therethrough. Also associated with the interior of the housing is a cooling source such as liquid nitrogen as well as a uniquely designed mount for operative connection with the cooling source. In addition, it is essential that the mount incorporate therein a non-reflective, optically transmissive, good heat conductive substrate, preferably made of sapphire, in order to provide effective heat removal to take place from the semiconductor crystal mounted thereon. For maximum heat transfer, a second non-reflective, transmissive heat conductive material may also be placed adjacent the semiconductor crystal within the chamber.

In addition, a mounting arrangement for two dimensional or two directional semiconductor crystal movement in conjunction with the chamber is formed as part of the external configuration of the housing. Focusing and defocusing means, preferably in the form of a pair of microscope objectives, are adjustably incorporated to the outer structure adjacent the transmissive windows of the Dewar cooling chamher in order to enable a pump beam and laser beam to be focused upon the semiconductor crystal held within the housing, and for the ensuing fluorescence to be defocused and collimated thereby, allowing lasing action to continue within the ring-shaped resonant cavity.

Since it is essential in the present invention to substantially reduce the heat which is generated in the semiconductor crystal it is necessary for the space between the housing windows and the sapphire substrate (and any other heat removing material) to be minimal. Therefore, there must be no other elements in the housing interposed within the optical path followed by a laser beam through the semiconductor crystal except for these heat removing elements.

For appropriate temperature control of the semiconductor crystal within the Dewar cooling chamber of this invention, a heat source in the form of a controllable electrical heater element is situated adjacent the crystal mount. By the selective utilization of the heater element it is possible to aid in the tuning of the semiconductor ring laser in which the Dewar cooling chamber of this invention is incorporated.

It is therefore an object of this invention to provide a transmissive Dewar cooling chamber capable of adequately cooling a semiconductor crystal or crystal platelet such that the crystal can be used as a lasing medium within a semiconductor ring laser.

It is another object of this invention to provide a transmissive Dewar cooling chamber which provides for two dimensional movement of the semiconductor within the semiconductor ring laser.

It is still a further object of this invention to provide externally mounted focusing and defocusing elements in order for the cooling chamber to be effectively used within a semiconductor ring laser.

It is still a further object of this invention to provide a transmissive Dewar cooling chamber which is economical to produce and which utilizes conventional, currently available components that lend themselves to standard, mass producing, manufacturing techniques.

For a better understanding of the present invention, together with other and further objects thereof, reference is made to the following description taken in conjunction with the accompanying drawing and its scope will be pointed out in the appended claims.

DETAILED DESCRIPTION OF THE DRAWING

DETAILED DESCRIPTION OF THE PREFERRED EMBODIMENTS

Figure 1:
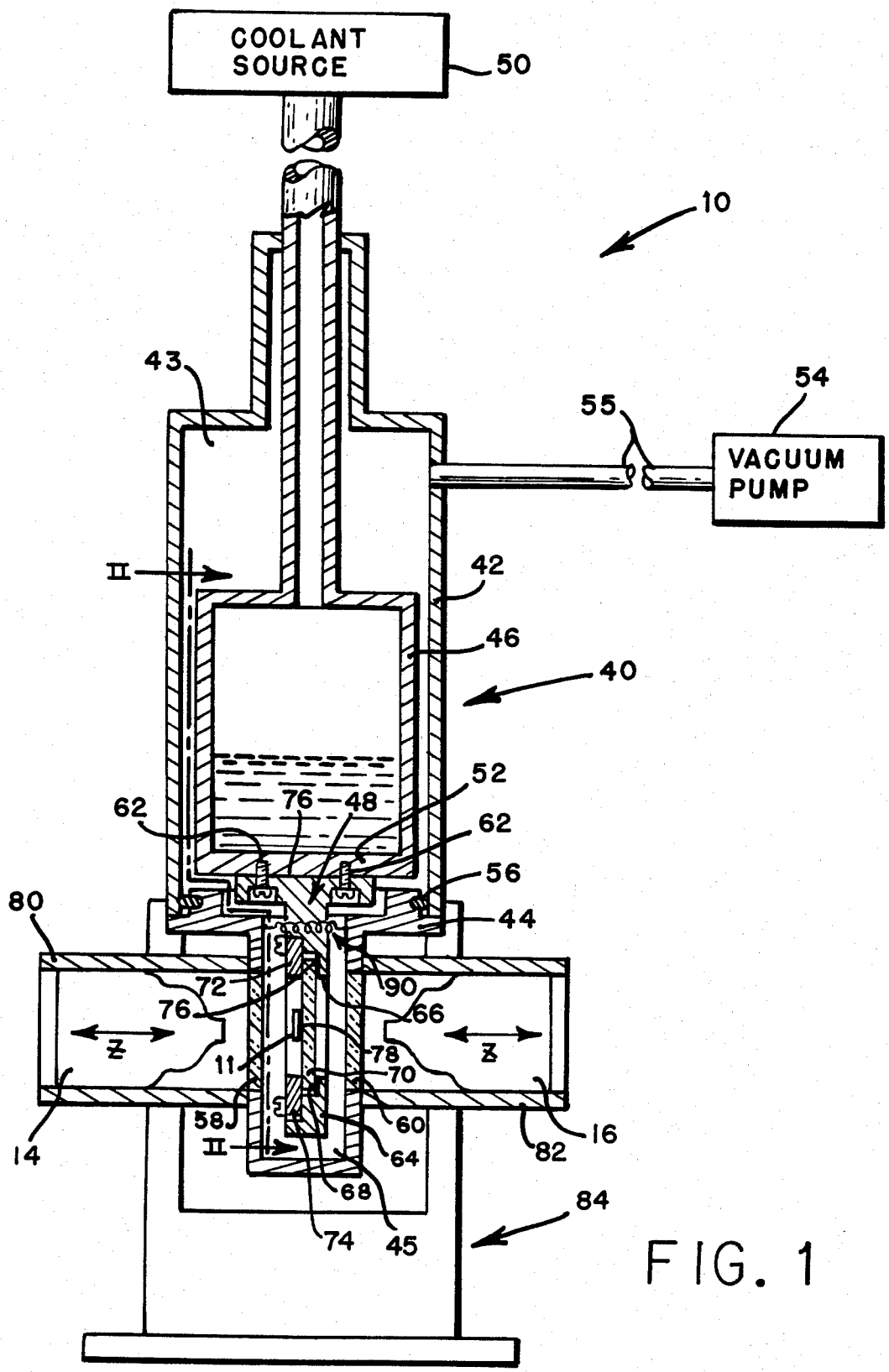
FIG. 1 is a side elevational view of the transmissive Dewar cooling chamber of this invention shown partly in cross section.
Figure 2:
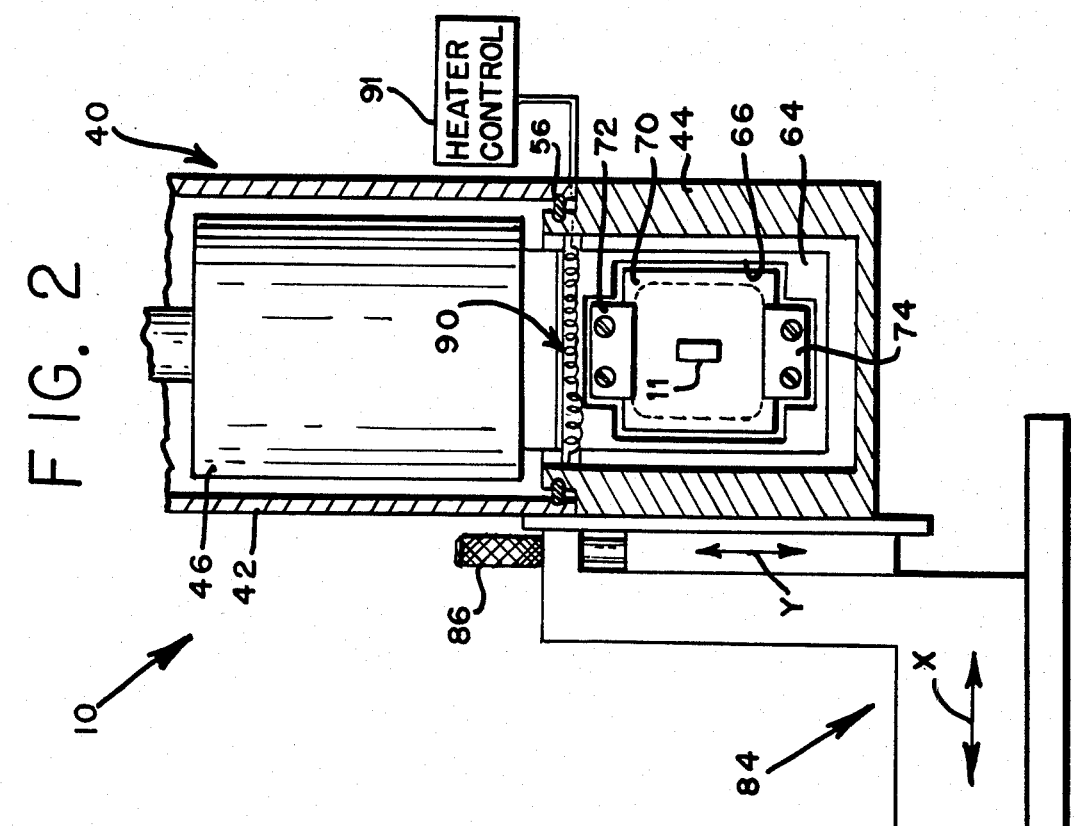
FIG. 2 is a cross sectional front view of the transmissive Dewar cooling chamber of this invention taken along line II—II of FIG. 1 and shown partly in cross section.
Figure 3:
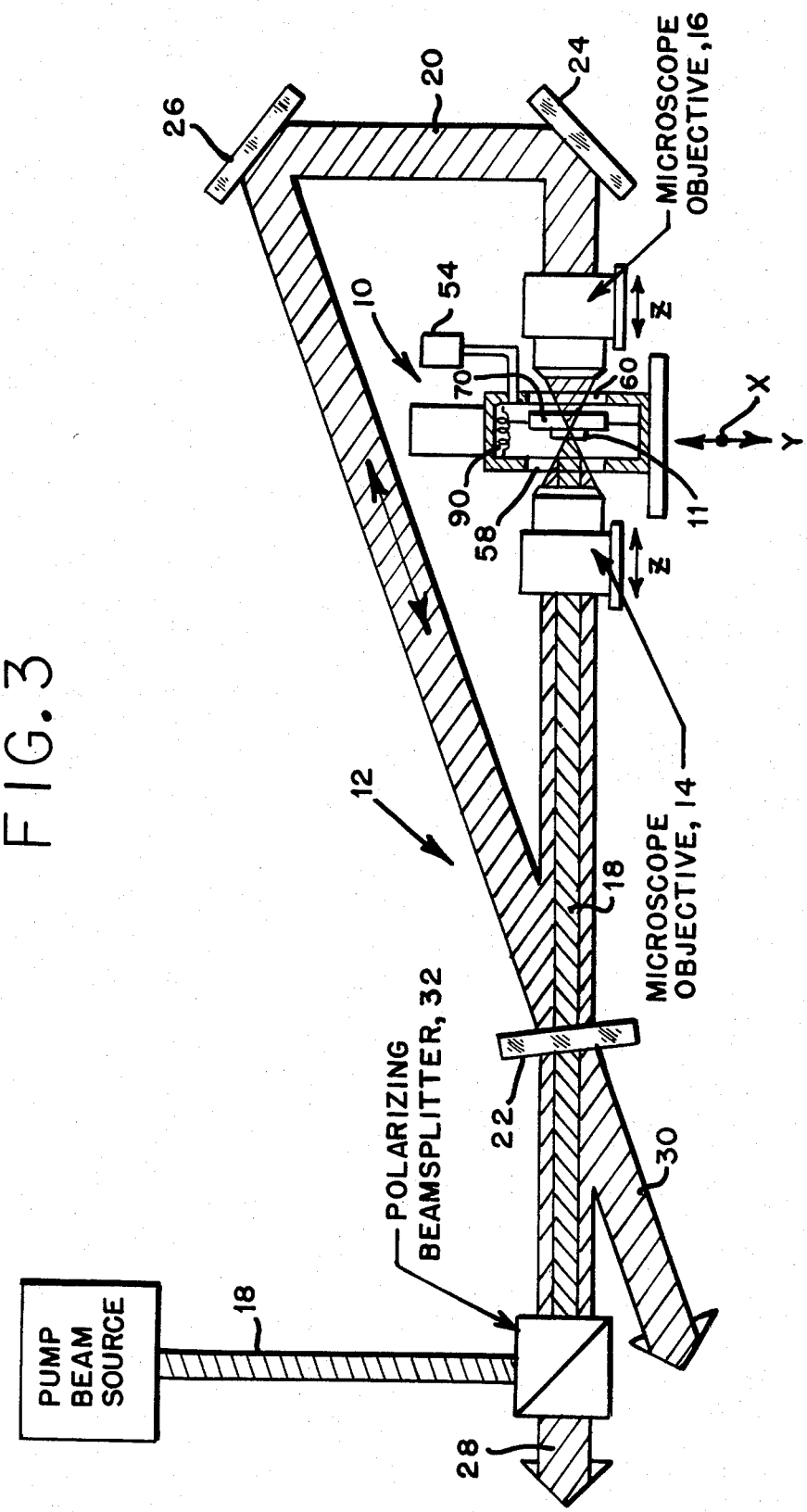
FIG. 3 is a schematic illustration of the transmissive Dewar cooling chamber of this invention in use within a semiconductor ring laser system.

Reference is now made to FIGS. 1 and 2 of the drawing which clearly illustrate the transmissive Dewar cooling chamber 10 of this invention. Dewar cooling chamber 10 supports therein a semiconductor crystal or crystal platelet 11 made of any suitable semiconductor material such as cadmium sulfide. Although the primary use of Dewar cooling chamber 10 of the present invention is within a ring laser, it is not limited to a specific type of a ring laser. FIG. 3 of the drawing is representative of an optically pumped CW semiconductor ring laser 12, more fully described in the above-referred to U.S. patent application Ser. No. 552,554 filed herewith, and with which the Dewar cooling chamber 10 of the present invention can be utilized. Since the semiconductor ring laser 12 does not form part of the present invention, it will be described hereinbelow only briefly in order for the operation of the Dewar cooling chamber 10 to be more clearly understood.

Semiconductor ring laser 12 incorporates Dewar cooling chamber 10 within the ring-shaped resonant cavity thereof. A pair of microscope objectives 14 and 16 focus the pump beam 18 onto the semiconductor crystal 11 within chamber 10 as well as focus and defocus the laser beam 20. A series of reflecting elements 22, 24 and 26 are located external of the cooling chamber 10 in optical alignment with each other in order to form the ring-like laser or resonant cavity. One of these reflecting elements 22 is also used in order to output a pair of laser beams 28 and 30 produced by the ring laser 12. A polarizing beam splitter 32 is utilized to direct the pump beam 18 into the resonant cavity of laser 12.

Reference is once again made to FIGS. 1 and 2 of the drawing in order to more fully and clearly describe the cooling chamber 10 of the present invention. More specifically, cooling chamber 10 is made up of a housing 40, preferably in the form of an upper section 42 and a lower section 44, defining therein, respectively, a pair of chambers 43 and 45. The upper section 42 of housing 40 includes therein a suitable cooling reservoir 46 as well as having mount 48 for semiconductor crystal 11 secured thereto. An example of such a coolant reservoir 46 would be one which includes a coolant source 50, for providing liquid nitrogen for example, operably connected thereto. Reservoir 46 is made of a stainless-steel tubing, with the bottom thereof being made of a material having good thermal conductivity such as copper. In so doing the Dewar cooling chamber 10 is able to provide appropriate conductive connection to mount 48. Any suitable vacuum pump 54 can be operably connected to upper section 42 by line 55 in order to create an appropriate vacuum within housing 40.

The other or lower section 44 of housing 12 of cooling chamber 10 is securely affixed to the upper chamber 42 by any conventional securing means (not shown) and a suitable gasket or O-ring seal 56. Located within lower section 46 are a pair of oppositely disposed optically transparent windows 58 and 60, preferably made of glass. Windows 58 and 60 are transmissive at the wavelength of operation of semiconductor ring laser 12 with which the Dewar cooling chamber 10 of this invention is utilized. In order to aid in the transmissivity windows 58 and 60 can be coated with any suitable anti-reflection (AR) coating. Situated within the lower section 46 of housing 42 and juxtaposed windows 58 and 60 is the semiconductor crystal mount 48. As described above, mount 48 is secured at its upper end to the bottom 52 of reservoir 46 by any suitable securing means such as screw 62.

The semiconductor crystal mount 48 is made up of a frame 64 formed of any suitable, excellent heat conducting material such as copper. Frame 64 has a preferably square cutout section 66 having a lip 68 formed therearound. The cutout section 66 is positioned so it is in optical alignment with the windows 58 and 60 of lower section 44. Positioned against lip 68 is a non-reflective, optically transparent or transmissive mounting substrate 70, preferably made of sapphire. Substrate 70 is also transmissive at the wavelength of interest for laser operation. A pair of heat conductive, thermal conductor restraints 72 and 74 are utilized to secure sapphire substrate 70 in place so that the coolant within reservoir 46 is capable of having its lower temperature conducted onto substrate 70 through frame 64. Thin sheets 76 of indium (~0.2 mm) are inserted between the sapphire substrate 70 and the copper frame 64 as well as between the copper frame 64 and the bottom 52 of the liquid nitrogen reservoir 46 in order to insure good thermal connections therebetween. Further, the bottom 52 of reservoir 46 as well as the copper frame 64 can be gold plated in order to reduce radiation losses.

Crystal 11 is secured to the sapphire substrate 70 by means of using a thin film of low viscosity silicone oil 78 applied upon substrate 70 adjacent crystal 11. Crystal 11 is held in place on substrate 70 by surface tension. The oil layer 78 is often less than 5 micrometers thick and does not crack when cooled.

Adjacent each side of lower section 44 of cooling chamber 10 and external thereto are a pair of stages or mounts 80 and 82, respectively, which enable appropriate focusing and defocusing elements to be secured therein for translational motion in the Z direction. The focusing/defocusing elements are both in the form of conventional microscope objectives 14 and 16 placed in front of and in back of the transparent windows 58 and 60, respectively. By mounting microscope objectives 14 and 16 so as to be movable within mounts or stages 80 and 82, it is possible to move the microscope objectives along the Z axis, thereby focusing the incoming pump beam 18 (as shown in FIG. 3 of the drawing) onto the semiconductor crystal 11 as well as to focus and defocus the intracavity semiconductor laser beam 20. An example of a type of microscope objective which can be utilized with the present invention would be a Leitz EF 10/0.25P microscope objective.

Referring now more specifically to FIG. 2 of the drawing, the entire housing 40 of cooling chamber 10 of the present invention is mounted on a translational mount 84 capable of providing two dimensional movement to housing 40 and thereby crystal 11. This translational movement takes place along the Y axis and X axis and is accomplished by the appropriate adjustment of a pair of micrometer heads 86 and 88, respectively. In this manner, it is possible to position crystal 11 (which is affixed to sapphire substrate 70) in its appropriate relationship with respect to an incoming pump beam 18 or with respect to the laser beam 20 within the semiconductor ring laser 12 as illustrated in FIG. 3 of the drawing.

Also located within the lower section 44 of cooling chamber 10 is a heating element 90, preferably in the form of an electrical heater which can be controlled externally by means of a conventional rheostat or heater control 91 in order to provide accurate temperature control of the environment surrounding crystal 11. This fine or accurate temperature control provides a temperature in the range of approximately 85° K. to 140° K. for crystal 11 and can therefore be utilized in tuning of ring laser 12.

Figure 4:
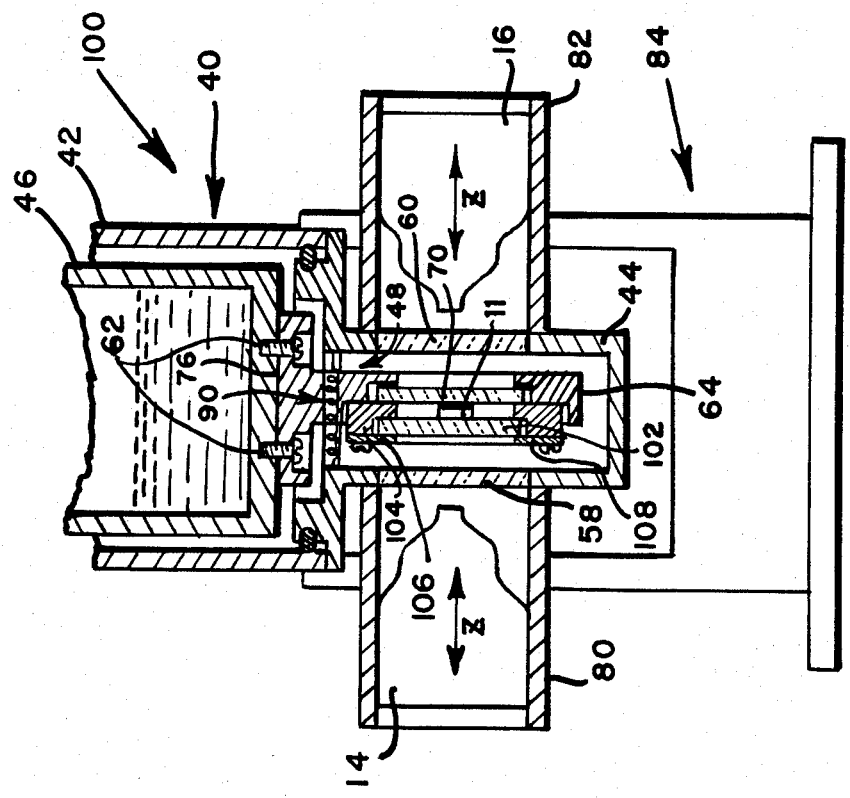
FIG. 4 is a side elevational view of an alternate embodiment of the transmissive Dewar cooling chamber of this invention shown partly in cross section.

It is has been found, however, that in some instances even greater temperature control and cooling capability for crystal 11 is desired. This can be accomplished with the embodiment of Dewar cooling chamber 100 as set forth in FIG. 4 of the drawing. Therefore, reference is now made to FIG. 4 of the drawing in which the alternate embodiment of the present invention is depicted. Since many of the elements which make up the Dewar cooling chamber 100 set forth in FIG. 4 of the drawing are identical to those elements which make up Dewar cooling chamber 10 illustrated in FIGS. 1 and 2 of the drawing, the same reference numerals will be utilized to identify identical elements in all the Figures of the drawing. Since the majority of such elements are identical, a detailed description of those identical elements will not be set forth hereinbelow. The major difference between the Dewar cooling chamber 100 as depicted in FIG. 4 and that of Dewar cooling chamber 10 resides in an additional cooling or heat conductive medium 102 being introduced between transparent window 58 and crystal 11. This heat conductive medium 102 is in the form of a piece of excellent heat conductive material such as sapphire affixed to frame 64 in the manner described hereinbelow.

Heat conductive material 102 is supported on a frame 104 which is utilized in place of the restraints 72 and 74 shown in FIGS. 1 and 2 of the drawing. By providing a frame 104 of good heat conductive material it is possible to position the second sapphire material 102 in abutting relationship with crystal 11. It is also necessary that this heat conductive sapphire material 102 be transmissive to the wavelength of interest when utilized within a ring laser 12 of the type depicted in FIG. 3 of the drawing. It is essential that both the laser beam 20 and pump beam 18 pass therethrough. In this manner it is possible to further introduce the cooling effect of frame 64 onto heat conductive material 102 and therefore onto crystal 11. What has been produced, in effect, is a crysta sandwich which provides for excellent heat removal capabilities. A pair of clamps or conductor restraints 106 and 108 fixedly secure sapphire material 102 to frame 104. The remaining components which make up the Dewar oooling chamber 100, as stated above, are the same as those which make up Dewar cooling chamber 10 and therefore need not be described in further detail.

It is possible with the transmissive Dewar cooling chamber 10 of this invention to maintain a semiconductor crystal 11 at a stable temperature of approximately 85° K. at approximately 20 m Torr. Cooling will take place in 5 minutes and the 100 ml capacity of the liquid-nitrogen reservoir 46 is sufficient to hold the temperature for approximately 4 hours without refilling. Accurate control of the temperature of the crystal 11 by means of the heating element allows for additional tuning of the ring laser to be achieved by changing the crystal temperature from approximately 85° K. to 140° K. with the resultant change in the wavelength of the output laser beams from 494 to 502 mm (0.14 mm/K). Although this invention has been described with reference to particular embodiments, it will be understood that this invention is also capable of further and other embodiments within the spirit and scope of the appended claims.

We claim:

1. A transmissive Dewar cooling chamber comprising:
   a housing, said housing having an upper chamber and a lower chamber, and said housing having walls made partially of material transmissive to a preselected wavelength, said transmissive material being situated juxtaposed said lower chamber in order to allow the passing of a beam of electromagnetic radiation of said preselected wavelength completely through said lower chamber of said housing;
   means located within said lower chamber and extending into said upper chamber for supporting an object in said lower chamber, said object being optically aligned with said transmissive material so that said beam of electromagnetic radiation is capable of passing completely through said object;
   means located in said upper chamber for providing a cooling environment for said object, said object supporting means being operably secured to said cooling means; and
   means operably secured to said housing for moving said housing and thereby said object in at least two dimensions.

2. A transmissive Dewar cooling chamber as defined in claim 1 further comprising a first and second focusing element located external to and adjacent opposite sides of said transmissive material of said lower chamber of said housing, each of said focusing elements being in optical alignment with said object.

3. A transmissive Dewar cooling chamber as defined in claim 2 further comprising means connected to said housing for adjustably mounting said first and second focusing elements thereto.

4. A transmissive Dewar cooling chamber as defined in claim 3 further comprising means for providing a vacuum in said upper and lower chambers of said housing.

5. A transmissive Dewar cooling chamber as defined in claim 1 wherein said object supporting means comprises a frame made of excellent heat conductive material, said frame having an opening therein, a mount made of excellent heat conductive material and transmissive to said preselected wavelength being positioned within said opening in said frame, means connected to said frame for securing said mount thereto, and said object being secured to said mount adjacent said transmissive material of said housing.

6. A transmissive Dewar cooling chamber as defined in claim 5 further comprising means located within said housing for controllably heating the environment surrounding said object within said lower chamber in order to effectively control the temperature of said object.

7. A transmissive Dewar cooling chamber as defined in claim 6 further comprising a first and second focusing element located external to and adjacent opposite sides of said transmissive material of said lower chamber of said housing, each of said focusing elements being in optical alignment with said object.

8. A transmissive Dewar cooling chamber as defined in claim 7 further comprising means connected to said housing for adjustably mounting said first and second focusing elements thereto.

9. A transmissive Dewar cooling chamber as defined in claim 8 further comprising means for providing a vacuum in said upper and lower chambers of said housing.

10. A transmissive Dewar cooling chamber as defined in claim 5 wherein said means for securing said mount to said frame has an opening therein, an excellent heat conductive piece of material transmissive to said preselected wavelength being secured to said mount securing means and positioned within said opening therein adjacent said object whereby said object is sandwiched between said mount and said piece of heat conductive material.

11. A transmissive Dewar cooling chanber as defined in claim 10 further comprising means located within said housing for controllably heating the environment surrounding said object within said lower chamber in order to effectively control the temperature of said object.

12. A transmissive Dewar cooling chamber as defined in claim 11 further comprising a first and second focusing element located external to and adjacent opposite sides of said transmissive material of said lower chamber of said housing, each of said focusing elements being in optical alignment with said object.

13. A transmissive Dewar cooling chamber as defined in claim 12 further comprising means connected to said housing for adjustably mounting said first and second focusing elements thereto.

14. A transmissive Dewar cooling chamber as defined in claim 13 further comprising means for providing a vacuum in said upper and lower chambers of said housing.

15. A transmissive Dewar cooling chamber as defined in claim 14 wherein said excellent heat conductive transmissive material of said mount and said piece of excellent heat conductive material are both made of sapphire.

16. A transmissive Dewar cooling chamber as defined in claim 15 wherein said walls of transmissive material in said housing are in the form of a pair of glass windows.

17. A transmissive Dewar cooling chamber as defined in claim 16 wherein said object is a thin, semicondcutor crystal.

18. A transmissive Dewar cooling chamber as defined in claim 13 wherein said housing is made of a pair of sections, said sections defining said upper chamber and lower chamber, respectively.

19. A transmissive Dewar cooling chamber as defined in claim 5 wherein said means for providing said cooling environment is in the form of a reservoir containing a liquid coolant therein.

20. A transmissive Dewar cooling chamber as defined in claim 19 wherein said frame is fixedly secured to said coolant reservoir.

* * * * *